(12) United States Patent
Aoki et al.

(10) Patent No.: US 11,282,266 B2
(45) Date of Patent: Mar. 22, 2022

(54) THREE-DIMENSIONAL SHAPE DATA GENERATION APPARATUS, THREE-DIMENSIONAL MODELING APPARATUS, THREE-DIMENSIONAL SHAPE DATA GENERATION SYSTEM, AND NON-TRANSITORY COMPUTER READABLE MEDIUM STORING THREE-DIMENSIONAL SHAPE DATA GENERATION PROGRAM

(71) Applicant: FUJIFILM Business Innovation Corp., Tokyo (JP)

(72) Inventors: Teppei Aoki, Kanagawa (JP); Yasushi Uemura, Kanagawa (JP); Toshihiro Yoshida, Kanagawa (JP); Teruyuki Kojima, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 79 days.

(21) Appl. No.: 16/737,914

(22) Filed: Jan. 9, 2020

(65) Prior Publication Data

US 2021/0082175 A1 Mar. 18, 2021

(30) Foreign Application Priority Data

Sep. 12, 2019 (JP) .............................. JP2019-166508

(51) Int. Cl.
*G06T 15/20* (2011.01)
*G06T 7/543* (2017.01)
*G06T 17/10* (2006.01)

(52) U.S. Cl.
CPC ............ *G06T 15/205* (2013.01); *G06T 7/543* (2017.01); *G06T 17/10* (2013.01)

(58) Field of Classification Search
CPC ........ G06T 15/205; G06T 7/543; G06T 17/10
See application file for complete search history.

(56) References Cited

U.S. PATENT DOCUMENTS

| | | | | |
|---|---|---|---|---|
| 6,058,259 A | * | 5/2000 | Murakami | ............. G06T 17/10 345/420 |
| 9,582,933 B1 | * | 2/2017 | Mosterman | .......... G06K 9/2081 |
| 2002/0118187 A1 | * | 8/2002 | Batori | ..................... G06T 19/00 345/419 |
| 2003/0004596 A1 | * | 1/2003 | Landers | ............. G05B 19/4097 700/98 |
| 2016/0075087 A1 | * | 3/2016 | Manners | ............... B29C 64/106 700/98 |
| 2018/0173815 A1 | * | 6/2018 | Stiles | ...................... G06F 30/00 |
| 2020/0201284 A1 | * | 6/2020 | Edwards | ............. G05B 19/182 |

FOREIGN PATENT DOCUMENTS

| | | |
|---|---|---|
| JP | 2007241731 | 9/2007 |
| JP | 2013246782 | 12/2013 |
| JP | 5769097 | 8/2015 |

* cited by examiner

*Primary Examiner* — Terrell M Robinson
(74) *Attorney, Agent, or Firm* — JCIPRNET

(57) ABSTRACT

A three-dimensional shape data generation apparatus includes: a processor configured to obtain two-dimensional shape data representing a two-dimensional shape corresponding to a three-dimensional shape of a target to which attribute information is to be assigned, obtain the attribute information of the two-dimensional shape, and assign the obtained attribute information to at least some three-dimensional elements among plural three-dimensional elements representing the three-dimensional shape to generate three-dimensional shape data.

20 Claims, 13 Drawing Sheets

THREE-DIMENSIONAL SHAPE DATA GENERATION APPARATUS, THREE-DIMENSIONAL MODELING APPARATUS, THREE-DIMENSIONAL SHAPE DATA GENERATION SYSTEM, AND NON-TRANSITORY COMPUTER READABLE MEDIUM STORING THREE-DIMENSIONAL SHAPE DATA GENERATION PROGRAM

CROSS-REFERENCE TO RELATED APPLICATIONS

This application is based on and claims priority under 35 USC 119 from Japanese Patent Application No. 2019-166508 filed Sep. 12, 2019.

BACKGROUND

(i) Technical Field

The present invention relates to a three-dimensional shape data generation apparatus, a three-dimensional modeling apparatus, a three-dimensional shape data generation system, and a non-transitory computer readable medium storing a three-dimensional shape data generation program.

(ii) Related Art

JP2013-246782A discloses a drawing data management apparatus of associating attribute information to drawing data in which a graphic object by shape information and position information and a text object by a text string and position information are disposed in a two-dimensional drawing space and managing the drawing data based on the attribute information, the apparatus including: a drawing space collation unit which refers to template data in which the text object is disposed in a two-dimensional drawing space, and associates a drawing space of the drawing data and a drawing space of the template data; an area designation unit which designates an attribute extraction area for extracting the attribute information in the drawing space of the template data; an attribute information extraction unit which extracts the text object disposed in an area in the drawing space of the drawing data to which the attribute extraction area is associated; and an attribute information assignment unit which associates the extracted text string of the text object with the drawing data; in which the drawing space collation unit includes an object extraction unit which compares the drawing data and the template data and extracts the text object matching with the text string, and associates the drawing space of the drawing data and the drawing space of the template data based on position information of the extracted text object.

SUMMARY

Aspects of non-limiting embodiments of the present disclosure relate to a three-dimensional shape data generation apparatus, a three-dimensional modeling apparatus, a three-dimensional shape data generation system, and a non-transitory computer readable medium storing a three-dimensional shape data generation program capable of easily assigning an attribute to each three-dimensional element as compared with a case where a user manually assigns an attribute to each of a plurality of three-dimensional elements representing a three-dimensional shape.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a three-dimensional shape data generation apparatus including: a processor configured to obtain two-dimensional shape data representing a two-dimensional shape corresponding to a three-dimensional shape of a target to which attribute information is to be assigned, obtain the attribute information of the two-dimensional shape, and assign the obtained attribute information to at least some three-dimensional elements among a plurality of three-dimensional elements representing the three-dimensional shape to generate three-dimensional shape data.

BRIEF DESCRIPTION OF THE DRAWINGS

Exemplary embodiment(s) of the present invention will be described in detail based on the following figures, wherein.

DETAILED DESCRIPTION

Hereinafter, an exemplary embodiment of the present invention will be described in detail with reference to the accompanying drawings.

Figure 1:
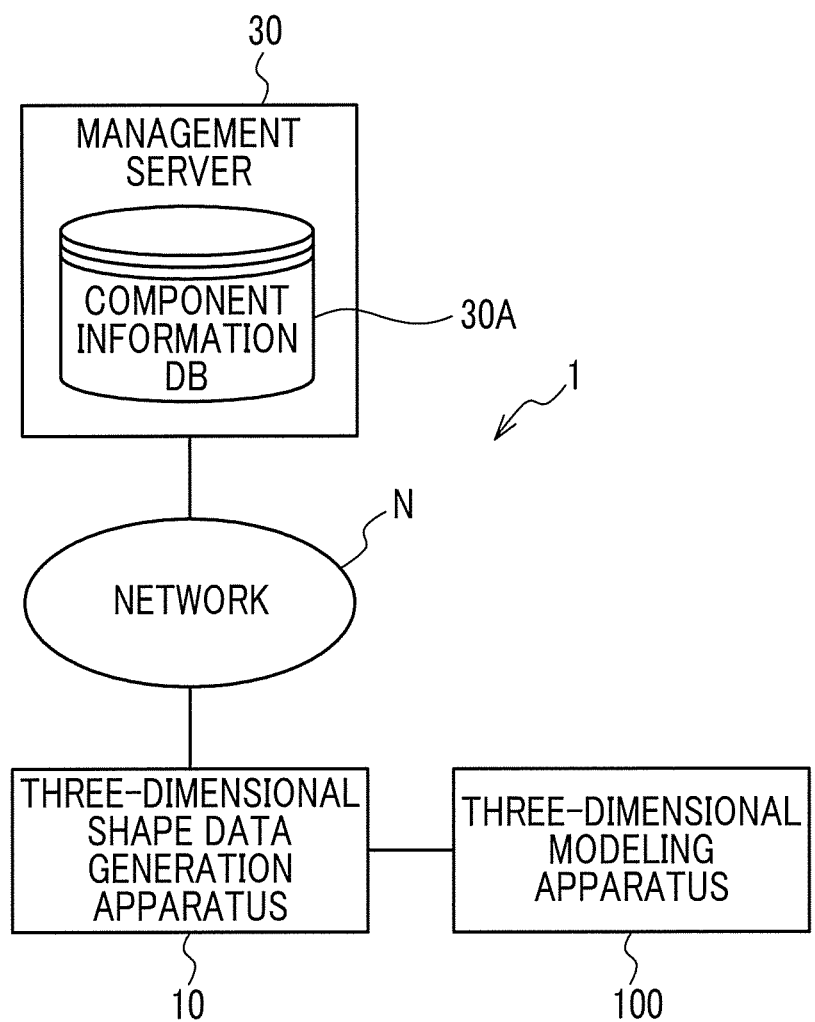
FIG. 1 is a configuration diagram of a three-dimensional shape data generation system.

FIG. 1 is a configuration diagram of a three-dimensional shape data generation system 1 according to the present exemplary embodiment. As illustrated in FIG. 1, the three-dimensional shape data generation system 1 has a configuration in which a three-dimensional shape data generation apparatus 10 and a management server 30 are connected via a network N. In addition, a three-dimensional modeling apparatus 100 is connected to the three-dimensional shape data generation apparatus 10. The management server 30 manages a component information database (DB) 30A as an example of a database.

Figure 2:
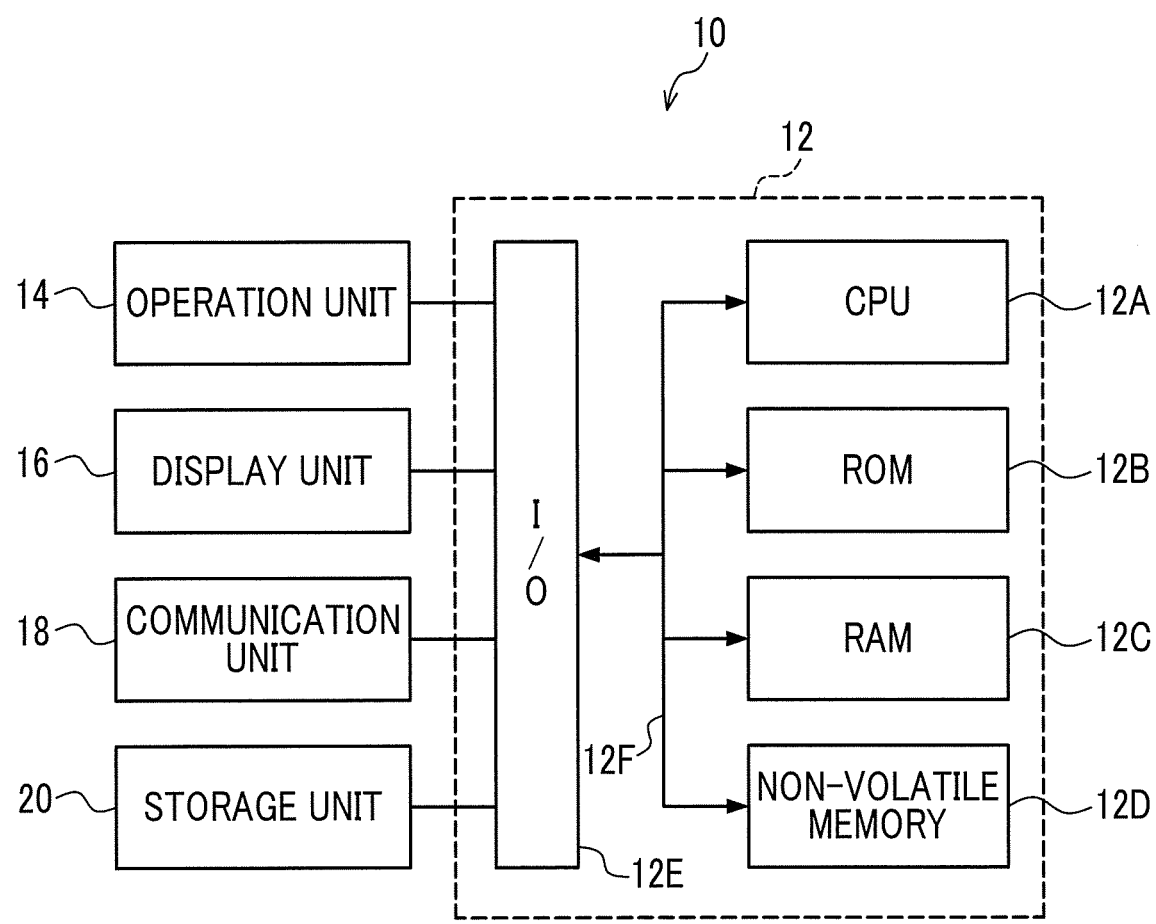
FIG. 2 is a configuration diagram of a three-dimensional shape data generation apparatus.

Next, a configuration of the three-dimensional shape data generation apparatus 10 according to the present exemplary embodiment will be described with reference to FIG. 2.

The three-dimensional shape data generation apparatus 10 is configured with, for example, a personal computer or the like and includes a controller 12. The controller 12 includes a central processing unit (CPU) 12A, a read only memory (ROM) 12B, a random access memory (RAM) 12C, a non-volatile memory 12D, and an input/output interface (I/O) 12E. The CPU 12A, the ROM 12B, the RAM 12C, the non-volatile memory 12D, and the I/O 12E are connected with one another via a bus 12F. The CPU 12A is an example of a processor.

In addition, an operation unit 14, a display unit 16, a communication unit 18, and a storage unit 20 are connected to the I/O 12E.

The operation unit 14 is configured to include a mouse, a keyboard, and the like, for example.

The display unit 16 is configured to include, for example, a liquid crystal display or the like.

The communication unit 18 is an interface for performing data communication with an external apparatus such as the three-dimensional modeling apparatus 100 or the like.

The storage unit 20 is configured with a non-volatile storage device such as a hard disc or the like and stores a three-dimensional shape data generation program or the like. The CPU 12A reads and executes the three-dimensional shape data generation program stored in the storage unit 20.

Next, a functional configuration of the CPU 12A will be described.

Figure 3:
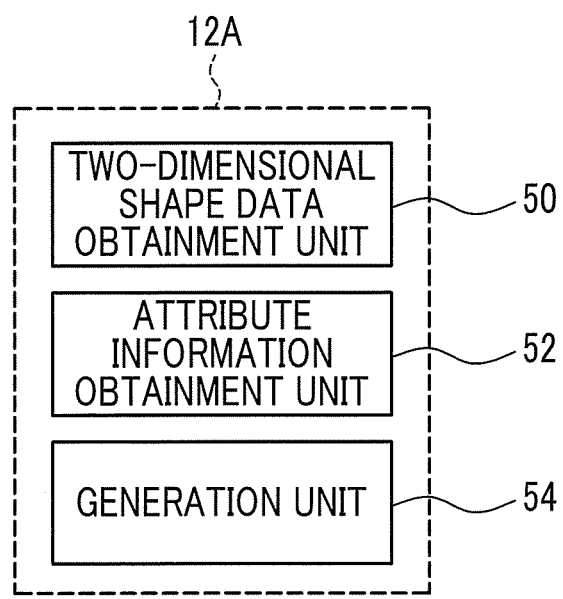
FIG. 3 is a block diagram illustrating a functional configuration of the three-dimensional shape data generation apparatus.

As illustrated in FIG. 3, the CPU 12A functionally includes a two-dimensional shape data obtainment unit 50, an attribute information obtainment unit 52, and a generation unit 54.

The two-dimensional shape data obtainment unit 50 obtains two-dimensional shape data representing a two-dimensional shape corresponding to a three-dimensional shape, to which attribute information is assigned, of a target. In the present exemplary embodiment, the three-dimensional shape of the target to which the attribute information is assigned is described as an example of a three-dimensional shape of a component constituting a finished product, but the present exemplary embodiment is not limited thereto. In addition, an example of the component includes a screw, a gear, or the like, but the present exemplary embodiment is not limited thereto.

The two-dimensional shape data is, for example, two-dimensional shape data for design including design information in a case of designing a three-dimensional shape, or two-dimensional shape data for production including production information required for producing a three-dimensional shape.

The attribute information is information related to properties of a three-dimensional shape, and may include various types of information such as a color, a material, strength, and the like. For example, the attribute information may include design information in a case of designing a three-dimensional shape. The design information may include various types of information such as information on dimensions of the three-dimensional shape, information on tolerances, information on processes, information on surface properties, information on welding, information on heat treatment, information on materials, information on technical standards and green procurement, and the like, for example.

In addition, for example, the attribute information may include production information in a case of producing a three-dimensional shape. The production information may include information for specifying the three-dimensional shape such as a component number or the like, information on instructions in a case of producing the three-dimensional shape (such as a modeling direction or the like of the three-dimensional shape), information on availability of a jig used during production, information on processing methods, information on delivery times, and the like, for example.

The two-dimensional shape data is data representing a two-dimensional shape as the three-dimensional shape is seen from a predetermined direction. In the present exemplary embodiment, a case where the two-dimensional shape data is drawing data of a blueprint in a case of designing the three-dimensional shape is described as an example, but the present exemplary embodiment is not limited thereto. In addition, the drawing data may be electronic drawing data in which the blueprint is defined by electronic data, or may be scan data obtained by scanning the blueprint.

The attribute information obtainment unit 52 obtains attribute information of the two-dimensional shape represented by the two-dimensional shape data which the two-dimensional shape data obtainment unit 50 obtains. For example, in a case where the obtained two-dimensional shape data is electronic drawing data, information such as dimensions or the like included in the electronic drawing data is obtained as the attribute information. Further, in a case where the two-dimensional shape data is scan data, for example, an optical character recognition (OCR) process is performed on the scan data, and information such as dimensions or the like is obtained as the attribute information. In a case where three-dimensional computer-aided design (CAD) data corresponding to the two-dimensional shape data can be obtained, information such as dimensions or the like included in the three-dimensional CAD data may be obtained as the attribute information.

The generation unit 54 generates three-dimensional shape data, that is, voxel data by assigning the attribute information obtained by the attribute information obtainment unit 52 to at least some voxels among a plurality of voxels representing a three-dimensional shape. The voxel is an example of a three-dimensional element.

Figure 4:
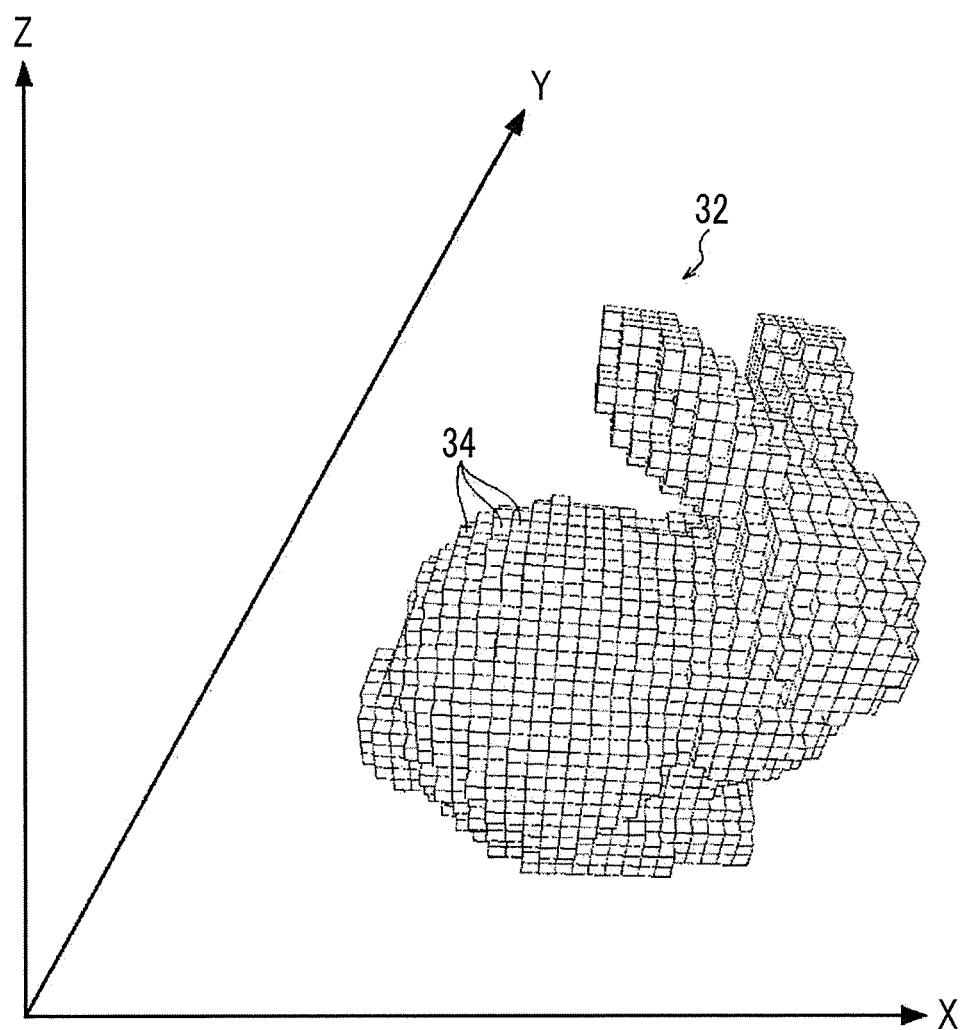
FIG. 4 is a diagram illustrating an example of a three-dimensional shape represented by voxel data.

FIG. 4 illustrates a three-dimensional shape 32 represented by three-dimensional shape data (voxel data) representing a three-dimensional shape as a set of voxels. As illustrated in FIG. 4, the three-dimensional shape 32 is configured by a plurality of voxels 34.

Here, the voxel 34 is a basic element of the three-dimensional shape 32 and for example, a rectangular parallelepiped is used, but the voxel 34 is not limited to the rectangular parallelepiped and a sphere, a cylinder, or the like may be used. By stacking the voxels 34, the required three-dimensional shape is expressed.

As a three-dimensional modeling method for modeling the three-dimensional shape, for example, a fused deposition modeling method (FDM) for modeling the three-dimensional shape by melting and a selective laser sintering method (SLS method) of modeling a three-dimensional shape by irradiating and sintering a powdered metal material with a laser beam, but another three-dimensional modeling method may be used. In the present exemplary embodiment, a case of modeling a three-dimensional shape by using the fused deposition modeling method will be described.

Next, a three-dimensional modeling apparatus of modeling a three-dimensional shape by using three-dimensional shape data generated by the three-dimensional shape data generation apparatus 10 will be described.

Figure 5:
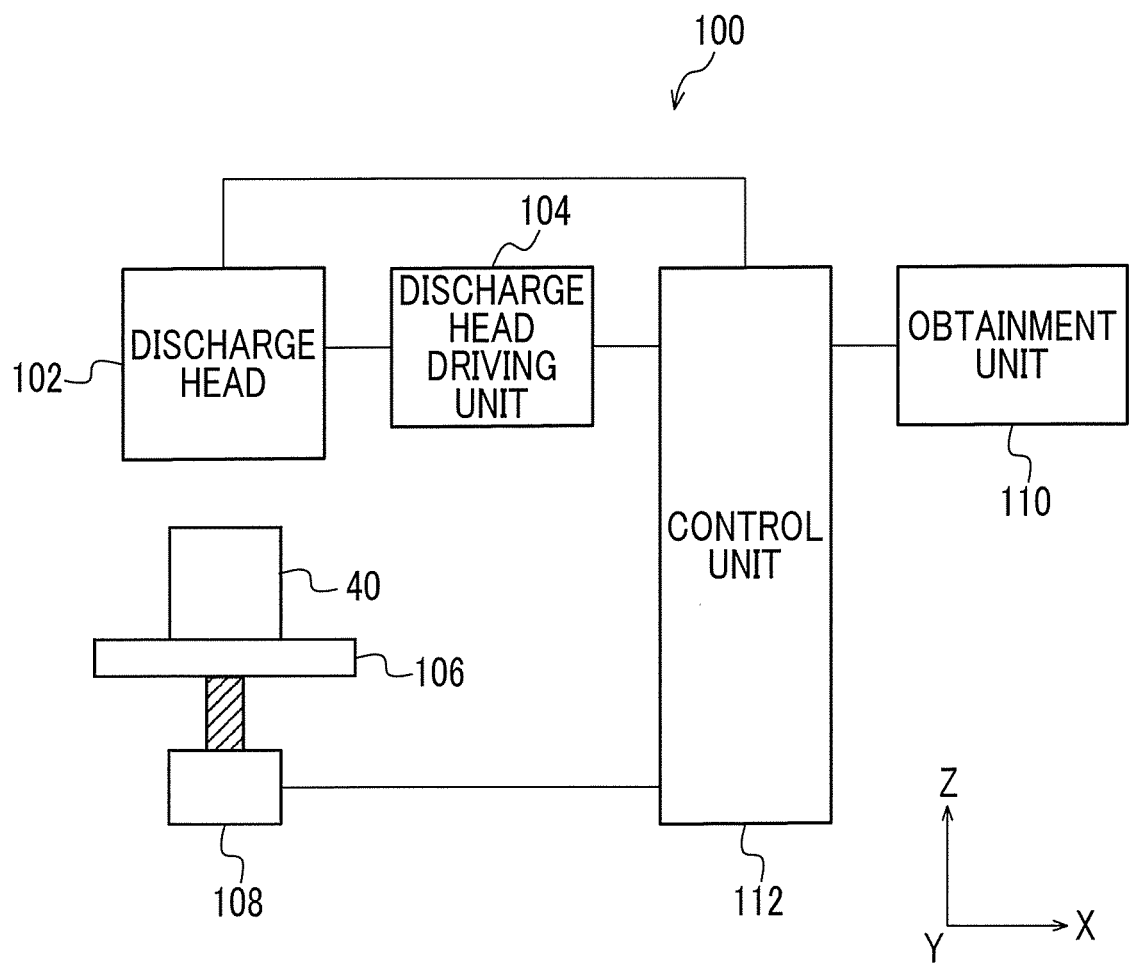
FIG. 5 is a configuration diagram of a three-dimensional modeling apparatus.

FIG. 5 illustrates a configuration of the three-dimensional modeling apparatus 100 according to the present exemplary embodiment. The three-dimensional modeling apparatus 100 is an apparatus which models a three-dimensional shape by the fused deposition modeling method.

As illustrated in FIG. 5, the three-dimensional modeling apparatus 100 includes a discharge head 102, a discharge head driving unit 104, a modeling table 106, a modeling table driving unit 108, an obtainment unit 110, and a control unit 112. The discharge head 102, the discharge head driving unit 104, the modeling table 106, and the modeling table driving unit 108 are examples of modeling units.

The discharge head 102 includes a modeling material discharge head of discharging a modeling material for modeling a three-dimensional shape 40 and a support material discharge head of discharging a support material. The support material is used for supporting an overhang portion (also referred to as "projecting portion") of the three-dimensional shape until modeling is completed and is removed after the modeling is completed.

The discharge head driving unit 104 drives the discharge head 102 and the discharge head 102 two-dimensionally performs scanning on an XY plane. Further, in some cases, the modeling material discharge head may include a plurality of discharge heads corresponding to modeling materials having a plurality of types of attributes (for example, colors).

The modeling table driving unit 108 drives the modeling table 106, and the modeling table 106 is moved up and down in the Z-axis direction.

The obtainment unit 110 obtains three-dimensional shape data and support material data generated by the three-dimensional shape data generation apparatus 10.

The control unit 112 causes the discharge head 102 to two-dimensionally perform scanning by driving the discharge head driving unit 104 and controls discharge of the modeling material and the support material by the discharge head 102 so that the modeling material is discharged according to the three-dimensional shape data obtained by the obtainment unit 110 and the support material is discharged according to the support material data.

In addition, every time the modeling of each layer is terminated, the control unit 112 drives the modeling table driving unit 108 so as to lower the modeling table 106 by a predetermined lamination interval. Accordingly, a three-dimensional shape based on the three-dimensional shape data is modeled.

Figure 6:
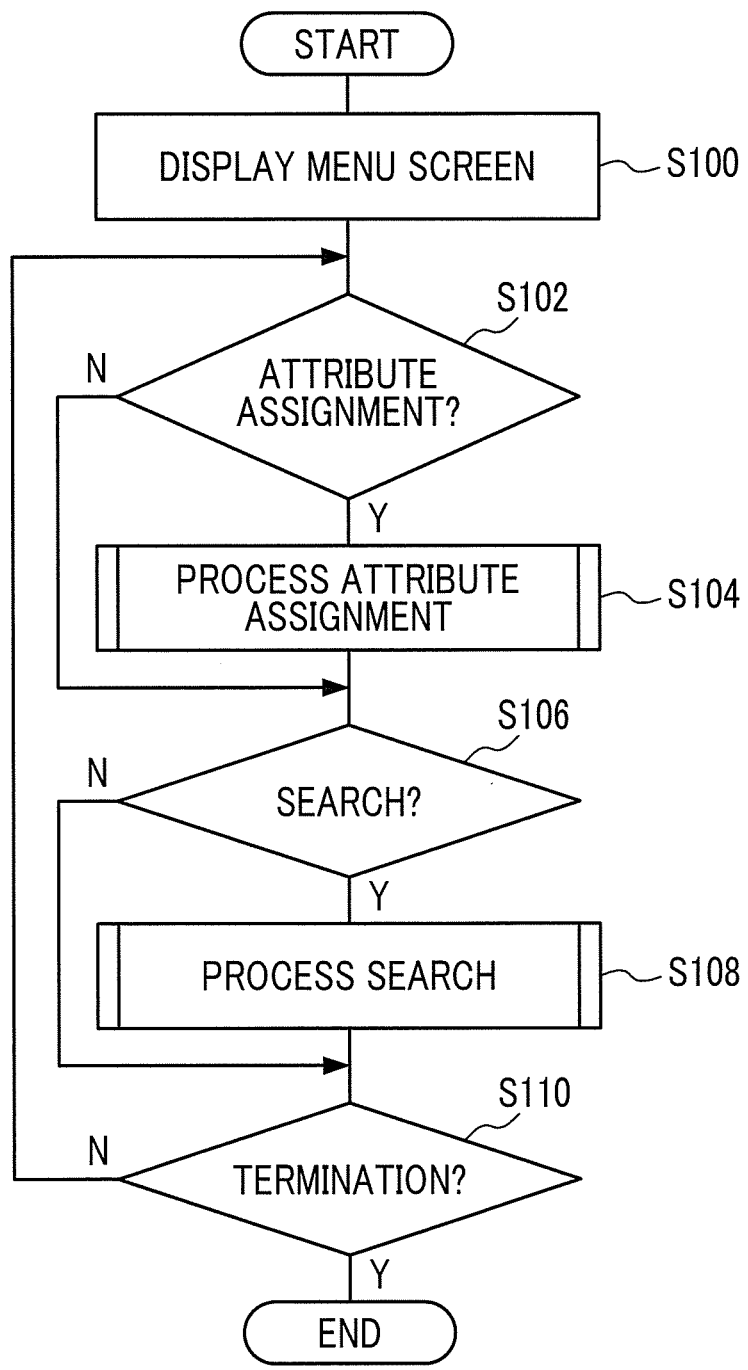
FIG. 6 is a flowchart illustrating a flow of a process by a three-dimensional shape data generation program.

Next, an action of the three-dimensional shape data generation apparatus 10 according to the present exemplary embodiment will be described with reference to FIG. 6. The CPU 12A executes a three-dimensional shape data generation program so as to execute a generation process illustrated in FIG. 6. The generation process illustrated in FIG. 6 is executed, for example, in a case where an operation of the user instructs to execute the generation program. In addition, in the present exemplary embodiment, description of the generation process on support material data is not repeated.

In step S100, the CPU 12A displays a menu screen (not illustrated) on the display unit 16. In the menu screen, it is possible to select one of an attribute assignment process of generating three-dimensional shape data by assigning attribute information to a voxel and a searching process of searching or the like the attribute information, and a user selects a required process.

In step S102, the CPU 12A determines whether or not the attribute assignment process is selected, and in a case where the attribute assignment process is selected, the process proceeds to step S104 and in a case where the attribute assignment process is not selected, the process proceeds to step S106.

Figure 7:
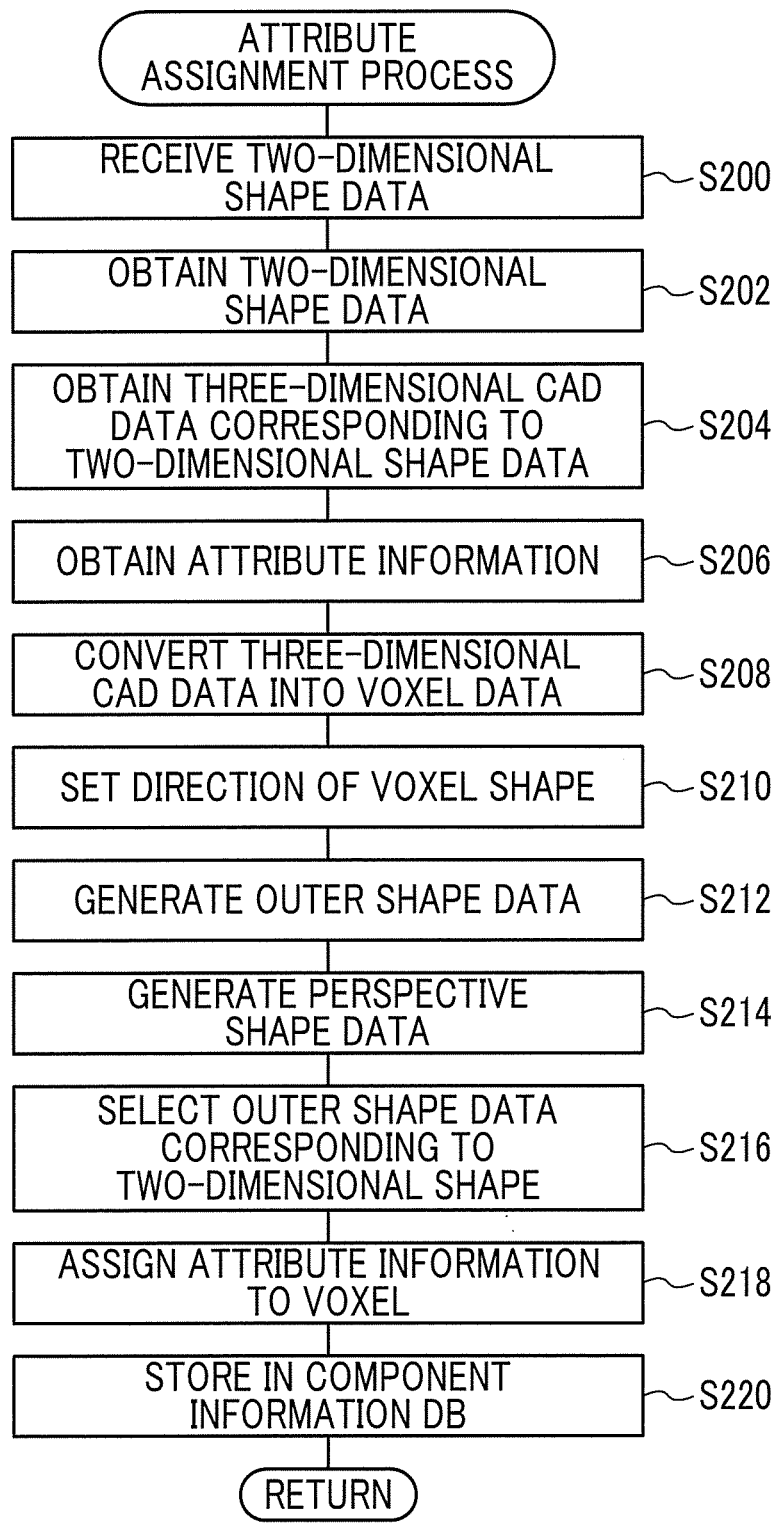
FIG. 7 is a flowchart illustrating a flow of an attribute assignment process.

In step S104, the attribute assignment process illustrated in FIG. 7 is executed. The attribute assignment process will be described below.

In step S106, the CPU 12A determines whether or not the searching process is selected, and in a case where the searching process is selected, the process proceeds to step S108 and in a case where the searching process is not selected, the process proceeds to step S110.

Figure 8:
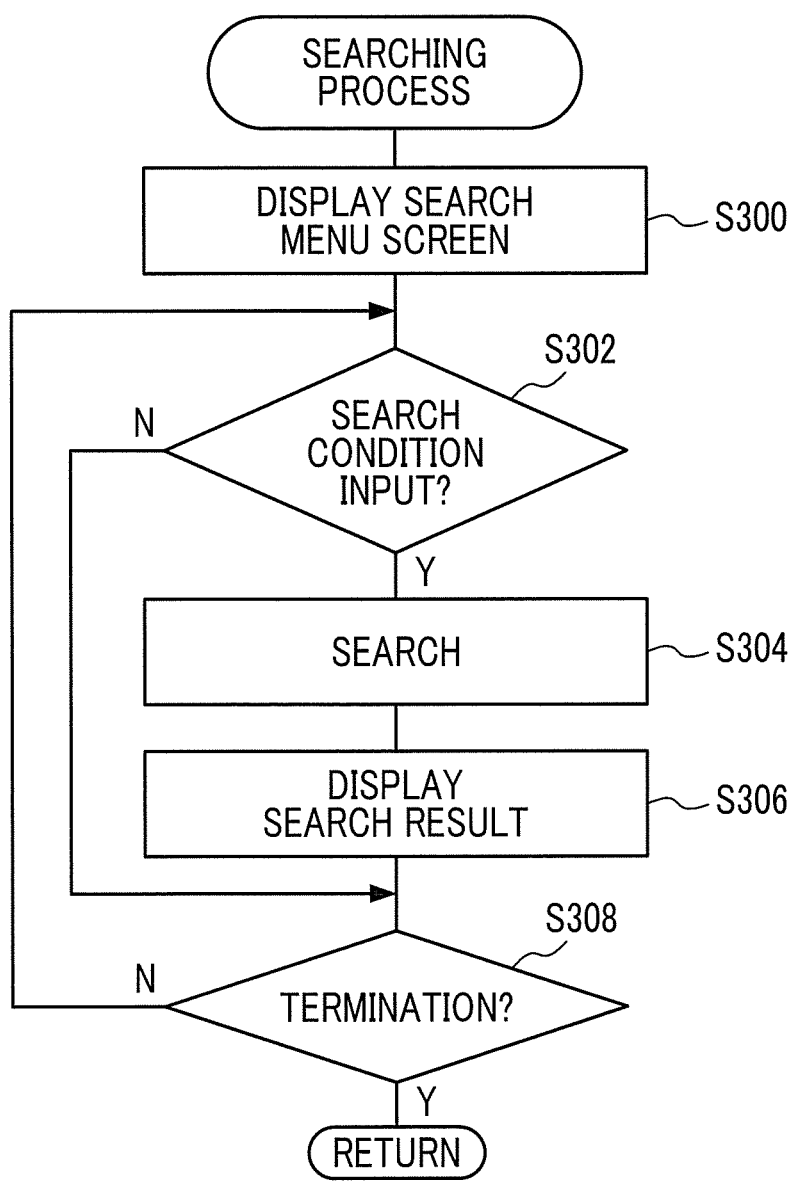
FIG. 8 is a flowchart illustrating a flow of searching process.

In step S108, the searching process illustrated in FIG. 8 is executed. The searching process will be described below.

In step S110, it is determined whether or not an operation of the user instructs to terminate the process, and in a case where the termination is not instructed, the process proceeds to step S102, and in a case where the termination is instructed, this routine is terminated.

Next, the attribute assignment process will be described with reference to the flowchart illustrated in FIG. 7. In the following, a case where two-dimensional shape data which is drawing data and three-dimensional CAD data corresponding to the two-dimensional shape data are stored in advance in the storage unit 20, in a case where the three-dimensional CAD data corresponding to the two-dimensional shape data is not stored in the storage unit 20, by using a known method, the three-dimensional CAD data corresponding to the two-dimensional shape data may be estimated.

In step S200, the CPU 12A receives two-dimensional shape data representing a two-dimensional shape corresponding to a three-dimensional shape, to which attribute information is assigned, of a target. For example, a reception screen for receiving two-dimensional shape data by an operation of the user is displayed on the display unit 16, the two-dimensional shape data designated by the user is received. On the reception screen, for example, it is possible to check pieces of two-dimensional shape data stored in the storage unit 20, and the user designates required two-dimensional shape data.

Figure 9:
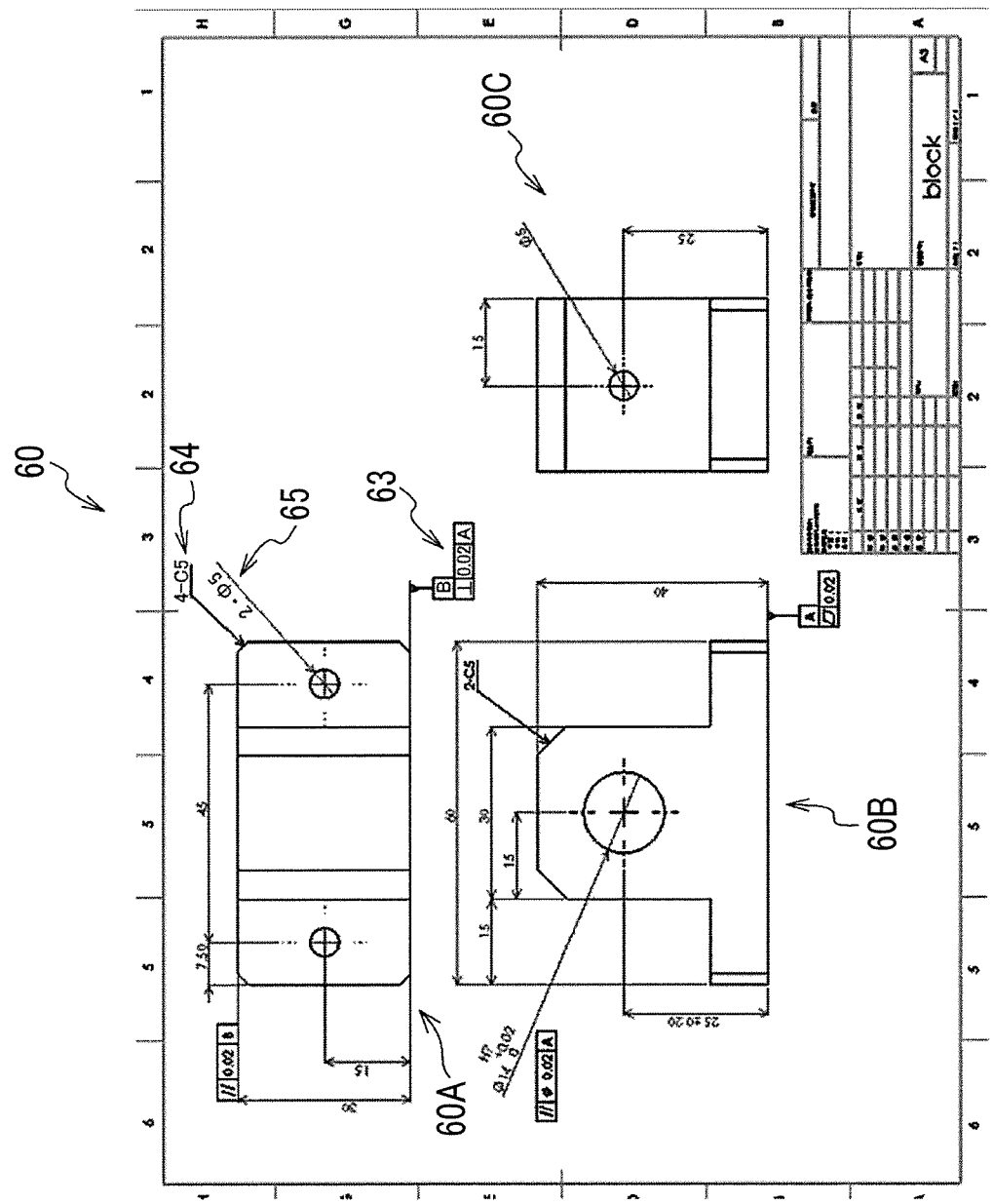
FIG. 9 is a diagram illustrating an example of two-dimensional shape data.

In step S202, the CPU 12A obtains the two-dimensional shape data received in step S200 by reading the two-dimensional shape data from the storage unit 20. FIG. 9 illustrates a design drawing 60 represented by two-dimensional shape data. As illustrated in FIG. 9, a plan view 60A, a front view 60B, and a right side view 60C are illustrated in the design drawing 60.

Figure 10:
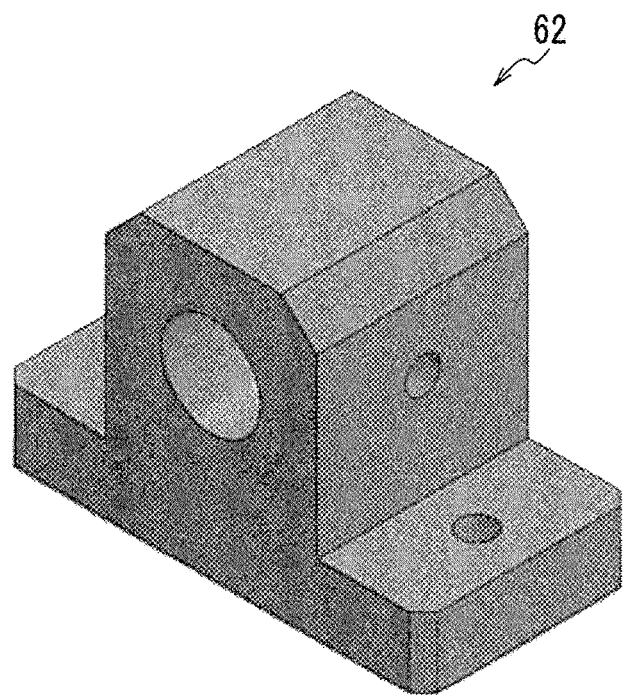
FIG. 10 is an example of a perspective view of a three-dimensional shape.

In step S204, the CPU 12A obtains three-dimensional CAD data corresponding to the two-dimensional shape data obtained in step S202 by reading the three-dimensional CAD data from the storage unit 20. FIG. 10 illustrates a perspective view of a three-dimensional shape 62 represented by the three-dimensional CAD data corresponding to the two-dimensional shape data representing the design drawing 60 illustrated in FIG. 9.

In step S206, the CPU 12A obtains attribute information of the two-dimensional shape represented by the two-dimensional shape data obtained in step S202. For example, in the design drawing 60 in FIG. 9, tolerance information is described as an example of permissible error information in a predetermined location of the two-dimensional shape.

Specifically, in the plan view 60A, tolerance information represented by "1", which is a symbol of tolerance of verticality and a numerical value of "0.02" indicating a permissible range of a parallelism error is described as attribute information 63. In addition, attribute information 64 represented by "C5" designating a chamfering numerical value, attribute information 65 represented by "φ5" designating a hole diameter, and the like are described.

The attribute information 63 to 65 and the like are also included in the three-dimensional CAD data corresponding to the two-dimensional shape data of the design drawing 60. Accordingly, in the present exemplary embodiment, attribute information included in the three-dimensional CAD data obtained in step S204 is obtained.

In a case where the three-dimensional CAD data corresponding to the two-dimensional shape data does not exist, as described above, in a case where the obtained two-dimensional shape data is electronic drawing data, information such as dimensions and the like included in the electronic drawing data may be obtained as the attribute information. Further, in a case where the two-dimensional shape data is scan data, for example, an OCR process is performed on the scan data, and information such as dimensions or the like may be obtained as the attribute information.

Figure 11:
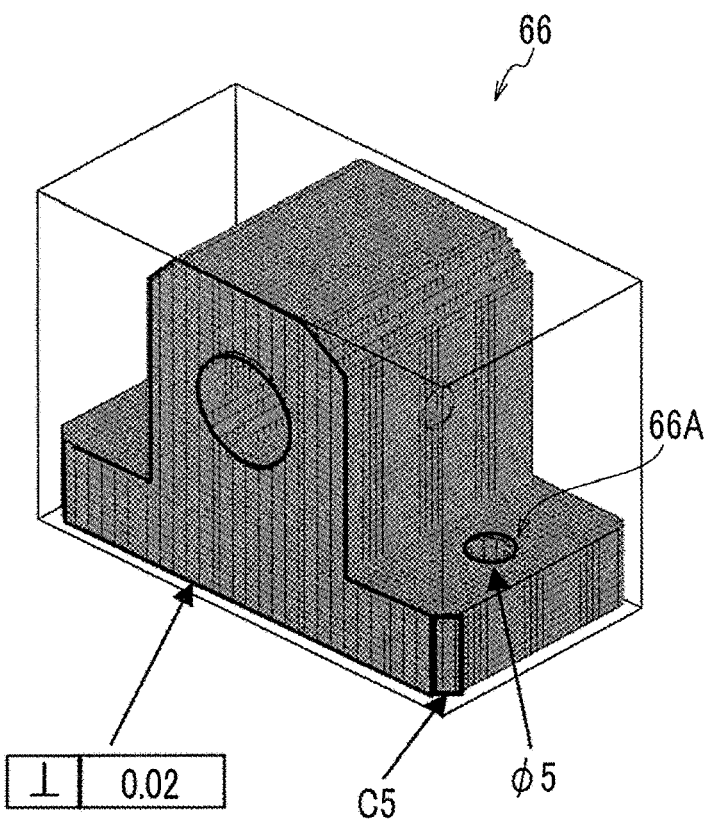
FIG. 11 is an example of a perspective view of a voxel shape.

In step S208, the CPU 12A converts the three-dimensional CAD data into voxel data. That is, a three-dimensional shape represented by the three-dimensional CAD data is converted into a set of a plurality of voxels. Hereinafter, the three-dimensional shape represented by voxel data, is referred to as a voxel shape. FIG. 11 illustrates a voxel shape 66 in a case where the three-dimensional CAD data representing the three-dimensional shape 62 illustrated in FIG. 10 is converted into voxel data.

Figure 12:
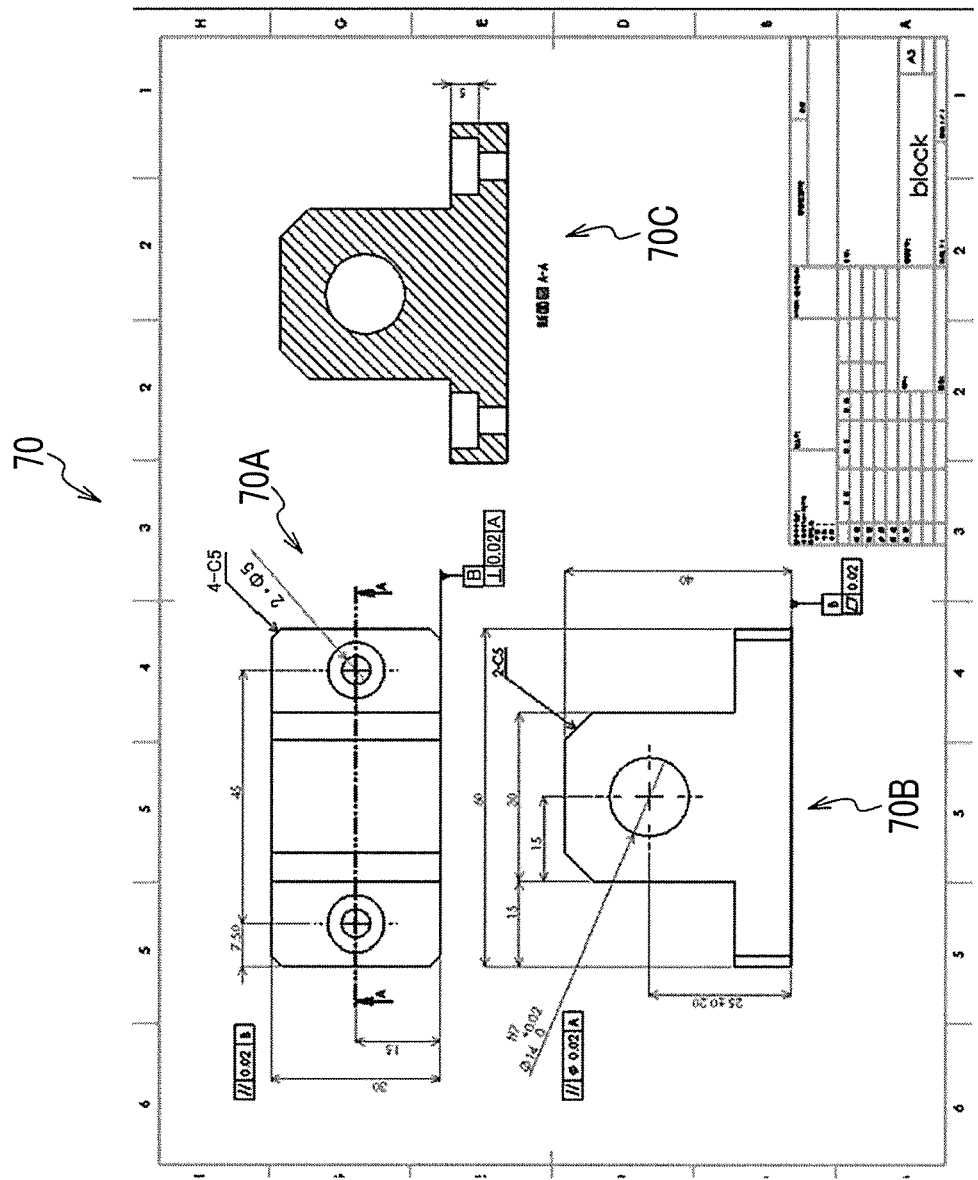
FIG. 12 is a diagram illustrating an example of two-dimensional shape data including a cross-sectional view.
Figure 13:
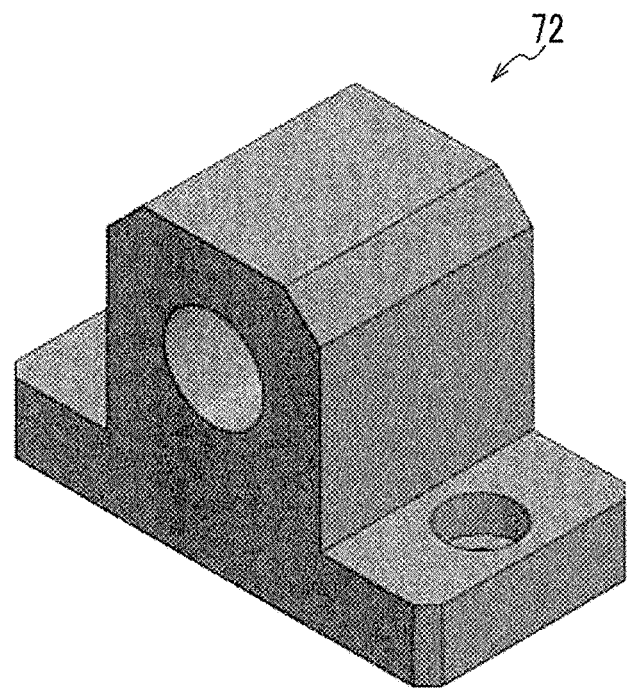
FIG. 13 is an example of a perspective view of another three-dimensional shape.
Figure 14:
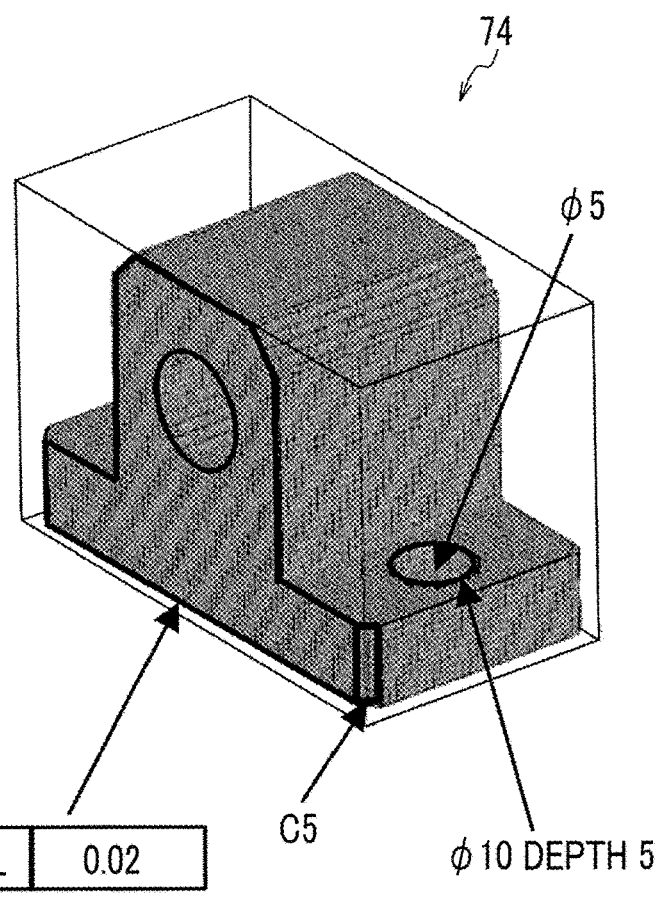
FIG. 14 is an example of a perspective view of another voxel shape.

Here, in a case where the two-dimensional shape data includes cross section data representing a cross section of a two-dimensional shape, an internal structure of a three-dimensional shape may be specified from the cross section data and voxel data representing the three-dimensional shape with a plurality of voxels may be generated from three-dimensional CAD data as surface data representing a surface shape of the three-dimensional shape and the specified internal structure. FIG. 12 illustrates a design drawing 70 including cross section data as an example. Further, FIG. 13 illustrates a perspective view of a three-dimensional shape 72 represented by three-dimensional CAD data corresponding to two-dimensional shape data representing the design drawing 70 illustrated in FIG. 12. As illustrated in FIG. 12, the design drawing 70 includes a cross-sectional view 70C in addition to a plan view 70A and a front view 70B. In this case, an internal structure of a three-dimensional shape is specified from the cross-sectional view 70C, and three-dimensional CAD data is converted into voxel data. FIG. 14 illustrates a voxel shape 74 in a case where the three-dimensional CAD data representing the three-dimensional shape 72 illustrated in FIG. 13 is converted into voxel data.

In step S210, the CPU 12A sets a direction of the voxel shape so as to generate outer shape data representing an outer shape as the voxel shape is seen from six different directions. Specifically, in a case where the voxel shape is disposed in a three-dimensional space represented by an X axis, a Y axis, and a Z axis orthogonal to each other, the direction of the voxel shape is set so that a length in the X axis direction is the longest and a length in the Y axis direction is the shortest.

Figure 15A:
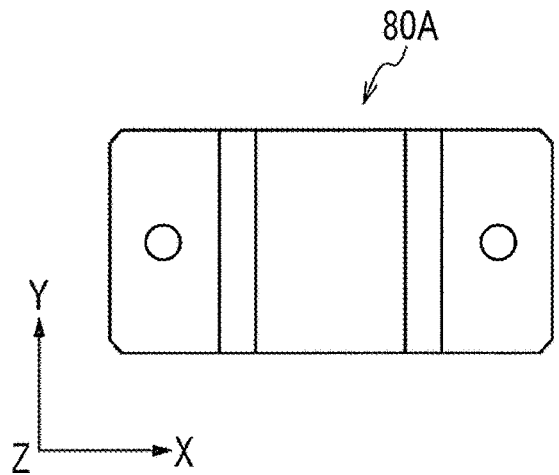
FIGS. 15A to 15F are examples of six-sided views.
Figure 15D:
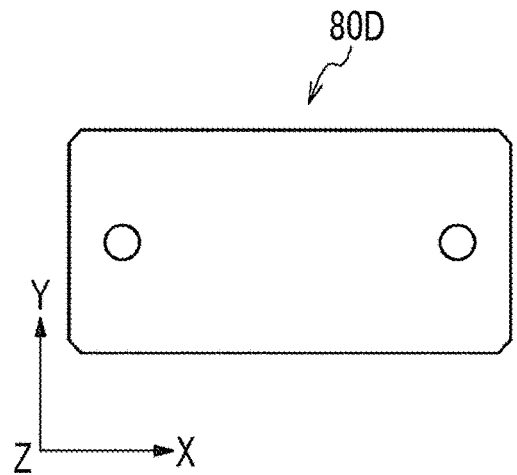
Figure 15B:
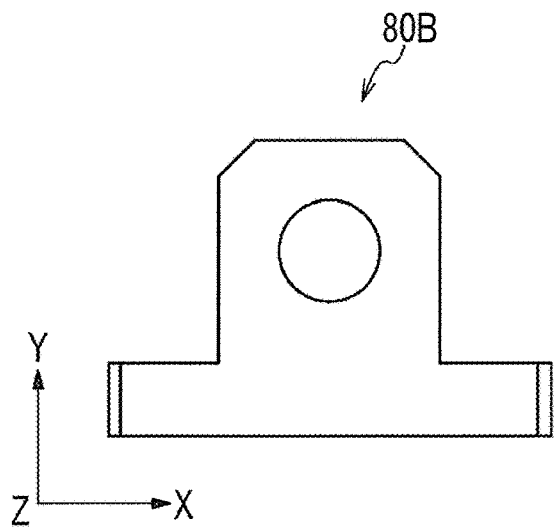
Figure 15E:
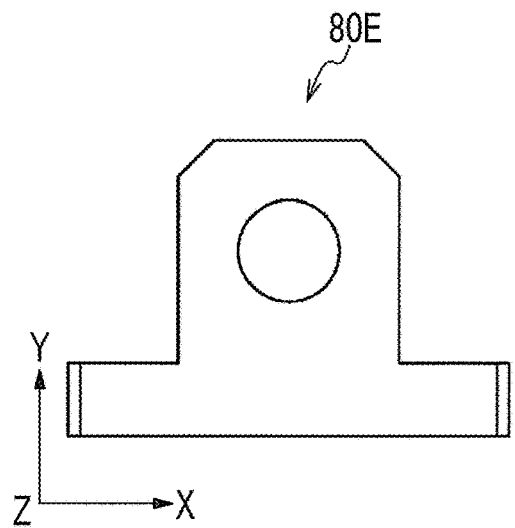
Figure 15C:
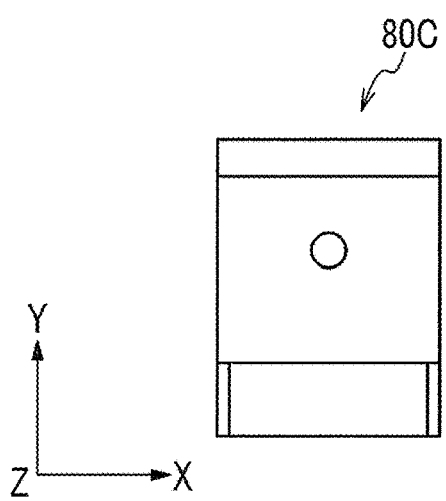
Figure 15F:
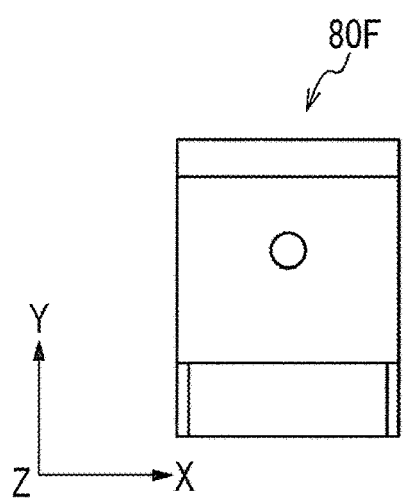

The outer shape data is data representing a so-called six-sided view as an example in the present exemplary embodiment. That is, the outer shape data is six-sided view data representing a front view, a rear view, a left side view, a right side view, a plan view, and a bottom view of the voxel shape. FIG. 15A illustrates a plan view 80A, FIG. 15B illustrates a front view 80B, FIG. 15C illustrates a right side view 80C, FIG. 15D illustrates a bottom view 80D, FIG. 15E illustrates a rear view 80E, and FIG. 15F illustrates a left side view 80F as six-sided views of the voxel shape 66 illustrated in FIG. 11. In this case, as represented by the plan view 80A, a direction of the voxel shape is set so that a length in the X axis direction is the longest and a length in the Y axis direction is the shortest.

In step S212, the CPU 12A generates outer shape data, that is, data representing six-sided views as illustrated in FIGS. 15A to 15F from the voxel data. In the present exemplary embodiment, a case where all six-sided views are generated will be described, but the present exemplary embodiment is not limited thereto and at least one drawing among the six-sided views may be generated. For example, in a case where there is a view as the three-dimensional shape is seen from three different directions, it is easier to specify the shape of the three-dimensional shape, so that data of three views of a front view or a rear view, a left side view or a right side view, and a plan view or a bottom view may be generated.

In step S214, the CPU 12A generates perspective shape data representing a perspective shape when the voxel shape is seen from a predetermined perspective direction, from the voxel data. That is, data of a perspective view of the voxel shape 66 as illustrated in FIG. 11 is generated. The perspective direction may be set by the user.

In step S216, the CPU 12A selects an outer shape data of an outer shape corresponding to the two-dimensional shape represented by the two-dimensional shape data obtained in step S202, among the outer shape data generated in step S214. That is, the outer shape data having an identical shape with the two-dimensional shape represented by the two-dimensional shape data is selected. The determination of whether or not the outer shape and the two-dimensional shape have the identical shape may be performed by using a known method such as pattern matching or the like. Further, instead of automatically selecting the outer shape data, the user may select the outer shape data.

For example, in a case of the example in FIG. 9, the design drawing 60 includes the plan view 60A, the front view 60B, and the right side view 60C, so that among the six-sided views illustrated in FIGS. 15A to 15F, the plan view 80A, the front view 80B, and the right side view 80C having the identical shape as the plan view 60A, the front view 60B, and the right side view 60C are selected.

In step S218, the CPU 12A generates voxel data by assigning the attribute information obtained in step S206 to a voxel corresponding to the outer shape represented by the outer shape data selected in step S216.

At this time, after positioning the two-dimensional shape corresponding to the attribute information obtained in step S206 and the outer shape represented by the outer shape data selected in step S216, the attribute information is assigned to the voxel.

In addition, in a case where the attribute information is assigned to the voxel, a meaning of the attribute information is interpreted from the two-dimensional shape data, and the attribute information is assigned to the voxel in accordance with the meaning of the interpreted attribute information. In the example in FIG. 9, attribute information such as attribute information 63 to 65 is assigned to voxels at positions corresponding to locations to which these pieces of attribute information are assigned in the design drawing. For example, the attribute information 63 indicating the tolerance of verticality and the attribute information 64 indicating the chamfering numerical value are assign to, for example, voxels on a surface as the voxel shape 66 is seen from a front view, as illustrated in FIG. 11. Further, the attribute information 65 indicating the hole diameter is assigned to voxels for one inner layer of a hole 66A in a case where the voxel shape 66 is seen in a plan view, for example. Attribute information having a meaning of the hole and attribute information having a center position of the hole may be assigned to the voxel.

In a case of material attribute information or the like, the attribute information may be assigned not only to voxels of the surface but also to internal voxels in a depth direction. Further, for example, the attribute information may be assigned to the internal voxel so that the attribute information defined according to a predetermined pattern is projected in the depth direction. In this case, the user may select the predetermined pattern.

In step S220, the CPU 12A stores the two-dimensional shape data obtained in step S202, the three-dimensional CAD data obtained in step S204, the attribute information obtained in step S206, the outer shape data generated in step S212, the perspective shape data generated in step S214, voxel data to which the attribute information is assigned in step S218 in association with one another in the component information database 30A of the management server 30.

The component information database 30A is a database in which different attribute information can be set for each of a plurality of composite component classifications set in a two-dimensional matrix obtained by combining two classifications of a functional classification, which is a classification from a design perspective, and a construction method and material classification, which is a classification from a procurement and manufacturing perspective (a productive perspective), in the same manner as a component database described in JP5769097B, for example. That is, design information is stored as attribute information in a case where two-dimensional shape data is two-dimensional shape data for design and production information is stored as the attribute information in a case where the two-dimensional shape data is two-dimensional shape data for production in association with a two-dimensionally set complex-classification obtained by combining two classifications of a classification by a design perspective and a classification by a productive perspective, in the component information database 30A.

Meta information may be assigned for each voxel-shaped lump (a projection portion or the like) and stored in the component information database 30A.

Further, in some cases, the design drawing is edited such as modification, a change, and the like of the design drawing, for example. In this case, the drawing data before the editing and the drawing data after the editing may be stored in association with each other in the component information database 30A. Difference data related to a difference between the drawing data before the editing and the drawing data after the editing may be extracted, and attribute information may be corrected based on the extracted difference data and stored in the component information database 30A.

Next, the searching process will be described with reference to FIG. 8.

In step S300, the CPU 12A displays a search menu screen (not illustrated) for inputting a search condition on the display unit 16. As the search condition, in the present exemplary embodiment, at least one of information of at least one of production information and design information, two-dimensional shape data, or perspective shape data can be received, as an example. The user inputs a required search condition on the search menu screen.

In step S302, the CPU 12A determines whether or not the search condition is input, and in a case where the search condition is input, the process proceeds to step S304 and in a case where the search condition is not input, the process proceeds to step S308.

In step S304, the CPU 12A access to the component information database 30A and searches for information corresponding to the input search condition. For example, in a case of receiving information of any one of the production information and the design information, the other information corresponding to the received one piece of information is searched from the component information database 30A as the search condition. For example, in a case where a component number included in production information is input as a search condition, design information corresponding to the component number is searched from the component information database 30A.

Further, in a case of receiving two-dimensional shape data as a search condition, attribute information associated with the received two-dimensional shape data is searched from the component information database 30A. For example, in a case where drawing data of a design drawing is input as a search condition, attribute information associated with the input drawing data is searched from the component information database 30A.

Further, in a case where perspective shape data is received as a search condition, three-dimensional shape data corresponding to a perspective shape similar to another perspective shape represented by the received perspective shape data is searched from the component information database 30A. For example, the other perspective shape similar to the perspective shape received as the search condition is searched by using a known method such as pattern matching, and three-dimensional shape data corresponding to the searched perspective shape is obtained.

Further, in a case where outer shape data is received as a search condition, three-dimensional shape data corresponding to an outer shape similar to another outer shape represented by the received outer shape data is searched from the component information database 30A. For example, the other outer shape having a number of voxels with a difference from the number of voxels of the outer shape received as the search condition within a permissible range is searched, and three-dimensional shape data corresponding to the searched outer shape is obtained. Here, the permissible range refers to a range in which it is considered that the outer shapes are identical.

In step S306, the CPU 12A displays a search result searched in step S304 on the display unit 16.

In step S308, the CPU 12A determines whether or not termination of the searching process is instructed, and in a case where the termination of the searching process is not instructed, the process proceeds to step S302, and in a case where the termination of the searching process is instructed, this routine is terminated.

Next, a case of modeling a three-dimensional shape based on three-dimensional shape data generated by the three-dimensional shape data generation apparatus 10 will be described.

The obtainment unit 110 of the three-dimensional modeling apparatus 100 obtains voxel data transmitted from the three-dimensional shape data generation apparatus 10. Further, the control unit 112 causes the discharge head 102 to two-dimensionally perform scanning by driving the discharge head driving unit 104 and controls discharge of a modeling material by the discharge head 102 so that the modeling material is discharged according to the voxel data obtained by the obtainment unit 110. Accordingly, the three-dimensional shape is modeled.

Although the present exemplary embodiment of the invention is described by using each of the exemplary embodiments, the present exemplary embodiment of the invention is not limited to the scope described in each of the exemplary embodiments. Various modifications or improvements can be added to each of the exemplary embodiments without departing from the gist of the present exemplary embodiment of the invention and the modified or improved form is also included in the technical scope of the present exemplary embodiment of the invention.

For example, in the present exemplary embodiment, a case where the three-dimensional shape data generation apparatus 10 which generates three-dimensional shape data and the three-dimensional modeling apparatus 100 which models a three-dimensional shape based on the three-dimensional shape data are separately provided, is described, but the three-dimensional modeling apparatus 100 may be provided with the function of the three-dimensional shape data generation apparatus 10.

That is, the obtainment unit 110 of the three-dimensional modeling apparatus 100 may obtain the voxel data and the control unit 112 executes the generation process in FIG. 6 so as to generate three-dimensional shape data.

In the embodiments above, the term "processor" refers to hardware in a broad sense. Examples of the processor includes general processors (e.g., CPU: Central Processing Unit), dedicated processors (e.g., GPU: Graphics Processing Unit, ASIC: Application Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

Further, in the present exemplary embodiment, a form in which the three-dimensional shape data generation program is installed in the storage unit 20 is described, but the exemplary embodiment is not limited thereto. The three-dimensional shape data generation program according to the present exemplary embodiment also may be provided to be recorded in a computer readable storage medium. For example, which the three-dimensional shape data generation program according to the present exemplary embodiment of the invention may be provided by being recorded on an optical disc such as a compact disc (CD)-ROM, a digital versatile disc (DVD)-ROM, and the like or by being recorded in a semiconductor memory such as a universal serial bus (USB) memory, a memory card, and the like. In addition, the three-dimensional shape data generation program according to the present exemplary embodiment may be obtained from an external apparatus via the communication line connected to the communication unit 18.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A three-dimensional shape data generation apparatus comprising:
 a processor configured to
  obtain two-dimensional shape data representing a two-dimensional shape corresponding to a three-dimensional shape of a target to which attribute information is to be assigned,
  obtain the attribute information of the two-dimensional shape,
  generate a plurality of outer shapes from the three-dimensional shape,
  specify an outer shape corresponding to the obtained two-dimensional shape data from the plurality of outer shapes,
  position the specified outer shape with the two-dimensional shape,
  identify a three-dimensional shape element to which the attribute information is to be assigned in accordance with the positioning, and
  assign the obtained attribute information to at least some three-dimensional elements among a plurality of three-dimensional elements representing the three-dimensional shape.

2. The three-dimensional shape data generation apparatus according to claim 1,
 wherein the processor interprets a meaning of the attribute information from the two-dimensional shape data, and assigns the attribute information to the three-dimensional element in accordance with the meaning of the interpreted attribute information.

3. The three-dimensional shape data generation apparatus according to claim 2,
 wherein the meaning is permissible error information at a predetermined location of the two-dimensional shape, and the processor assigns the permissible error information to a three-dimensional element of a position corresponding to the predetermined location.

4. The three-dimensional shape data generation apparatus according to claim 2,
 wherein the two-dimensional shape data includes cross section data representing a cross section of the two-dimensional shape, and the processor specifies an internal structure of the three-dimensional shape from the cross section data and generates the three-dimensional shape data representing the three-dimensional shape with a plurality of three-dimensional elements from surface data representing a surface shape of the three-dimensional shape and the internal structure.

5. The three-dimensional shape data generation apparatus according to claim 2,
 wherein the processor stores, in a database, the two-dimensional shape data and the three-dimensional shape data to which the attribute information is assigned in association with each other.

6. The three-dimensional shape data generation apparatus according to claim 3,
 wherein the two-dimensional shape data includes cross section data representing a cross section of the two-dimensional shape, and the processor specifies an internal structure of the three-dimensional shape from the cross section data and generates the three-dimensional shape data representing the three-dimensional shape with a plurality of three-dimensional elements from surface data representing a surface shape of the three-dimensional shape and the internal structure.

7. The three-dimensional shape data generation apparatus according to claim 3,
wherein the processor stores, in a database, the two-dimensional shape data and the three-dimensional shape data to which the attribute information is assigned in association with each other.

8. The three-dimensional shape data generation apparatus according to claim 1,
wherein the two-dimensional shape data includes cross section data representing a cross section of the two-dimensional shape, and the processor specifies an internal structure of the three-dimensional shape from the cross section data and generates the three-dimensional shape data representing the three-dimensional shape with a plurality of three-dimensional elements from surface data representing a surface shape of the three-dimensional shape and the internal structure.

9. The three-dimensional shape data generation apparatus according to claim 1,
wherein the processor stores, in a database, the two-dimensional shape data and the three-dimensional shape data to which the attribute information is assigned in association with each other.

10. The three-dimensional shape data generation apparatus according to claim 9,
wherein the two-dimensional shape data is two-dimensional shape data for design including design information in a case of designing the three-dimensional shape or two-dimensional shape data for production including production information required for producing the three-dimensional shape, and the processor stores, in the database, the design information as the attribute information in a case where the two-dimensional shape data is the two-dimensional shape data for design and stores the production information as the attribute information in a case where the two-dimensional shape data is the two-dimensional shape data for production in association with a two-dimensionally set complex-classification obtained by combining two classifications of a classification by a design perspective and a classification by a productive perspective.

11. The three-dimensional shape data generation apparatus according to claim 9,
wherein the processor receives the two-dimensional shape data, and searches for the attribute information associated with the received two-dimensional shape data from the database.

12. The three-dimensional shape data generation apparatus according to claim 9,
wherein the processor generates perspective shape data representing a perspective shape when the three-dimensional shape is viewed from a predetermined perspective direction from the three-dimensional shape data, and stores, in the database, the generated perspective shape data and the three-dimensional shape data in association with each other.

13. The three-dimensional shape data generation apparatus according to claim 9,
wherein the processor generates outer shape data representing at least one outer shape among outer shapes as the three-dimensional shape is viewed from six different directions, and stores, in the database, the generated outer shape data, the two-dimensional shape data, and the three-dimensional shape data to which the attribute information is assigned in association with one another.

14. The three-dimensional shape data generation apparatus according to claim 10,
wherein the processor receives information of any one of the production information and the design information, and searches for the other information corresponding to the received information from the database.

15. The three-dimensional shape data generation apparatus according to claim 12,
wherein the processor receives the perspective shape data, and searches for three-dimensional shape data corresponding to another perspective shape similar to the perspective shape represented by the received perspective shape data from the database.

16. The three-dimensional shape data generation apparatus according to claim 13,
wherein the processor selects an outer shape corresponding to the two-dimensional shape from outer shapes represented by the generated outer shape data, and assigns the attribute information to a three-dimensional element corresponding to the selected outer shape.

17. The three-dimensional shape data generation apparatus according to claim 13,
wherein the processor receives the outer shape data, and searches for three-dimensional shape data corresponding to another outer shape similar to the outer shape represented by the received outer shape data from the database.

18. A three-dimensional modeling apparatus comprising:
a modeling unit configured to model a three-dimensional shape based on three-dimensional shape data generated by the three-dimensional shape data generation apparatus according to claim 1, wherein the modeling unit comprises a discharge head.

19. A three-dimensional shape data generation system comprising:
the three-dimensional shape data generation apparatus according to claim 1; and
a management server that manages a database in which two-dimensional shape data representing a two-dimensional shape corresponding to a three-dimensional shape of a target to which attribute information is assigned and three-dimensional shape data generated by the three-dimensional shape data generation apparatus are stored in association with each other.

20. A non-transitory computer readable medium storing a three-dimensional shape data generation program causing a computer to execute a process, the process comprising:
obtaining two-dimensional shape data representing a two-dimensional shape corresponding to a three-dimensional shape of a target to which attribute information is to be assigned;
obtaining the attribute information of the two-dimensional shape;
generating a plurality of outer shapes from the three-dimensional shape;
specifying an outer shape corresponding to the obtained two-dimensional shape data from the plurality of outer shapes;
positioning the specified outer shape with the two-dimensional shape;
identifying a three-dimensional shape element to which the attribute information is to be assigned in accordance with the positioning; and assigning the obtained attribute information to at least some three-dimensional elements among a plurality of three-dimensional elements representing the three-dimensional shape.

* * * * *